United States Patent
Leng

(10) Patent No.: US 11,552,011 B2
(45) Date of Patent: Jan. 10, 2023

(54) METAL-INSULATOR-METAL (MIM) CAPACITOR AND THIN-FILM RESISTOR (TFR) FORMED IN AN INTEGRATED CIRCUIT STRUCTURE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 73 days.

(21) Appl. No.: 17/308,270

(22) Filed: May 5, 2021

(65) Prior Publication Data

US 2022/0302018 A1 Sep. 22, 2022

Related U.S. Application Data

(60) Provisional application No. 63/161,492, filed on Mar. 16, 2021.

(51) Int. Cl.
*H01L 23/522* (2006.01)
*H01L 21/768* (2006.01)
*H01L 49/02* (2006.01)

(52) U.S. Cl.
CPC .... *H01L 23/5223* (2013.01); *H01L 21/76877* (2013.01); *H01L 23/5228* (2013.01); *H01L 28/20* (2013.01); *H01L 28/91* (2013.01)

(58) Field of Classification Search
CPC .................................................. H01L 23/5223
See application file for complete search history.

(56) References Cited

U.S. PATENT DOCUMENTS

| 2003/0102522 A1* | 6/2003 | Lee | H01L 21/768 |
| | | | 257/532 |
| 2004/0036098 A1* | 2/2004 | Fujiki | H01L 28/60 |
| | | | 257/E21.582 |
| 2004/0238962 A1 | 12/2004 | Jung et al. | 257/758 |
| 2006/0024899 A1* | 2/2006 | Crenshaw | H01L 23/5223 |
| | | | 257/E21.019 |

(Continued)

FOREIGN PATENT DOCUMENTS

| CN | 103346067 B | 2/2017 | ............ H01L 21/02 |
| EP | 1471566 A2 | 10/2004 | ............ H01L 21/02 |

OTHER PUBLICATIONS

International Search Report and Written Opinion, Application No. PCT/US2021/049843, 14 pages, dated Dec. 10, 2021.

*Primary Examiner* — Omar F Mojaddedi
(74) *Attorney, Agent, or Firm* — Slayden Grubert Beard PLLC

(57) ABSTRACT

An integrated circuit structure includes a metal-insulator-metal (MIM) capacitor and a thin-film resistor (TFR) formed concurrently, using components of shared material layers. A first metal layer may be patterned to form lower components of an interconnect structure, MIM capacitor, and TFR, and a second metal layer may be patterned to form upper components of the interconnect structure, MIM capacitor, and TFR. A via layer may be deposited to form interconnect vias, a cup-shaped bottom electrode component of the MIM capacitor, and a pair of TFR contact vias for the TFR. An insulator layer may be patterned to form both an insulator for the MIM capacitor and an insulator cap over the TFR element.

21 Claims, 13 Drawing Sheets

(56) References Cited

U.S. PATENT DOCUMENTS

| | | | |
|---|---|---|---|
| 2006/0118907 A1* | 6/2006 | Park | H01L 23/5223 |
| | | | 257/532 |
| 2008/0157217 A1* | 7/2008 | Burke | H01L 23/5223 |
| | | | 257/E29.345 |
| 2011/0128692 A1 | 6/2011 | Gaul et al. | 361/679.31 |
| 2015/0255532 A1 | 9/2015 | Li | 257/537 |
| 2015/0348908 A1* | 12/2015 | Nagakura | H01L 28/60 |
| | | | 257/536 |
| 2019/0051596 A1* | 2/2019 | Suo | H01L 28/91 |

* cited by examiner

US 11,552,011 B2

METAL-INSULATOR-METAL (MIM) CAPACITOR AND THIN-FILM RESISTOR (TFR) FORMED IN AN INTEGRATED CIRCUIT STRUCTURE

RELATED APPLICATION

This application claims priority to commonly owned U.S. Provisional Patent Application No. 63/161,492 filed Mar. 16, 2021, the entire contents of which are hereby incorporated by reference for all purposes.

TECHNICAL FIELD

The present disclosure relates to analog components formed in integrated circuit devices, and more particularly to metal-insulator-metal (MIM) capacitors and thin-film resistors (TFRs) formed concurrently in an integrated circuit structure.

BACKGROUND

Capacitors and resistors formed monolithically in integrated circuit devices are referred to as integrated capacitors and resistors. Integrated capacitors and resistors are common elements in many integrated circuit devices. For example, various analog, mixed signal, and RF-CMOS (radio-frequency complimentary metal-oxide-semiconductor) integrated circuit devices use these two elements, i.e., integrated capacitors and resistors, separately or in combination with each other. Integrated capacitors and resistors may offer various advantages over discrete counterparts (i.e., off-chip capacitors and resistors). For example, as compared with typical discrete (off-chip) capacitors and resistors, integrated capacitors and resistors may often be produced at lower cost, system-on-chip devices including integrated capacitors and resistors may have a reduced pin count (which may provide improved ease-of-use and form factor), and may exhibit a reduced parasitic capacitance.

One type of integrated capacitor is the metal-insulator-metal (MIM) capacitor, which is constructed with a metal top plate, a metal bottom plate, and an insulator (dielectric material) sandwiched between the top and bottom metal plates. MIM capacitors typically provide better performance than alternatives, such as POP (polysilicon-oxide-polysilicon) capacitors and MOM (metal-oxide-metal) capacitors, due to lower resistance, better matching for analog circuits (e.g., matching device characteristics such as resistance and capacitance), and/or better signal/noise ratio.

One type of integrated resistor is the thin-film resistor (TFR), which includes a pair of TFR heads connected by a TFR element, or TFR film. The TFR element is often formed from SiCr (silicon chromium), SiCCr (silicon carbide chromium), TaN (tantalum nitride), NiCr (nickel chromium), AlNiCr (aluminum-doped nickel chromium), or TiNiCr (titanium nickel chromium), for example. TFRs typically offer better performance than poly resistors, for example providing better control of the resistor value and better (closer to zero) temperature coefficient of resistance (TCR) characteristics than polysilicon (poly) resistors.

MIM capacitors and TFRs are typically more expensive to build than other integrated capacitors and resistors. For example, the process for forming an MIM capacitor or TFR typically includes at least one additional mask layer as compared with other types of integrated capacitors and resistors. In addition, MIM capacitors and TFRs are typically constructed independent of each other, further compounding the number of additional mask layers involved in the manufacturing process.

There is a need to build integrated capacitors and resistors, in particular to construct MIM capacitors and TFRs together (concurrently), efficiently and at low cost.

SUMMARY

Embodiments of the present disclosure provide an integrated circuit structure including a three-dimensional (3D) MIM capacitor and a thin-film resistor (TFR) formed concurrently, and methods of forming such integrated circuit structure. In some embodiments, the MIM capacitor and TFR may be formed using only a single added mask layer, as compared with a background integrated circuit manufacturing process.

In some embodiments the MIM capacitor and TFR may be formed concurrently with an interconnect structure, e.g., using components of shared material layers. For example, (a) a first common metal layer may be patterned to form a lower interconnect wire, a bottom electrode plate of the MIM capacitor, and a pair of TFR heads, (b) a common via layer may be deposited to form interconnect vias, a cup-shaped bottom electrode component of the MIM capacitor, and a pair of TFR contact vias on which a TFR element is formed, (c) a common insulator layer may be patterned to form an insulator for the MIM capacitor and an insulator cap (protection layer) over the TFR element, and (d) a second common metal layer may be patterned to form an upper interconnect wire, a top electrode of the MIM capacitor, and a metal TFR cap.

One aspect provides an integrated circuit structure including an MIM capacitor and a TFR resistor. The MIM capacitor includes an MIM bottom electrode, an MIM top electrode, and an MIM insulator. The MIM bottom electrode includes a bottom electrode plate formed in a first metal layer, and a bottom electrode cup including a laterally-extending bottom electrode cup base and a plurality of vertically-extending bottom electrode cup sidewalls extending upwardly from the bottom electrode cup base. The MIM top electrode is formed in a second metal layer above the first metal layer. The MIM insulator includes an insulator base arranged between the MIM top electrode and the bottom electrode cup base, and a plurality of vertically-extending insulator sidewalls each arranged between the MIM top electrode and a respective bottom electrode cup sidewall. The TFR includes a pair of TFR heads formed in the first metal layer, and a TFR element connected to each TFR head by a TFR contact via.

In one embodiment, the MIM insulator is cup-shaped.

In one embodiment, the TFR contact vias and the vertically-extending bottom electrode cup sidewalls are formed in a dielectric region between the first and second metal layers.

In one embodiment, the TFR includes a TFR insulator cap (protection layer) formed on the TFR element, and the TFR insulator cap and the MIM insulator are formed in an insulator layer.

In one embodiment, the integrated circuit structure further includes an interconnect structure including a lower interconnect wire formed in the first metal layer, and an upper interconnect wire formed in the second metal layer and connected to the lower interconnect wire by at least one interconnect via.

In one embodiment, the MIM capacitor further includes a bottom electrode connection pad connected to the bottom electrode plate by at least one via, and the bottom electrode connection pad is formed in the second metal layer above the first metal layer.

In one embodiment, the TFR contact via connecting the TFR film to each TFR head has a width in a first lateral direction and a length in a second lateral direction at least 5 times the width in the first lateral direction.

In some embodiments, the first metal layer is an interconnect layer comprising copper or aluminum, and the second metal layer comprises aluminum. In other embodiments, the first metal layer is a silicided polysilicon layer including a metal silicide region formed on each of a plurality of polysilicon regions.

Another aspect provides an integrated circuit structure including (a) an interconnect structure, (b) an MIM capacitor, and (c) a TFR. The interconnect structure includes a lower interconnect wire, and an upper interconnect wire connected to the lower interconnect wire. The MIM capacitor includes a bottom electrode plate, an MIM top electrode, and an MIM insulator arranged between the MIM top electrode and the MIM bottom electrode plate. The TFR includes a pair of TFR heads and a TFR element connected to the pair of TFR heads. The lower interconnect wire, the bottom electrode plate, and the pair of TFR heads are formed in a first metal layer, and the upper interconnect wire and the MIM top electrode are formed in a second metal layer above the first metal layer.

In one embodiment, the MIM capacitor further comprises a bottom electrode connection pad formed in the second metal layer and connected to the bottom electrode plate by a via.

In one embodiment, the MIM capacitor includes a bottom electrode cup formed on the bottom electrode plate, wherein the bottom electrode cup includes a laterally-extending bottom electrode cup base formed on the bottom electrode plate, and a plurality of vertically-extending bottom electrode cup sidewalls. The MIM insulator and the MIM top electrode are at least partially located in an interior volume of the bottom electrode cup.

Another aspect provides a method of forming an integrated circuit structure including an MIM capacitor and a TFR. An integrated circuit structure including an MIM capacitor and TFR. A plurality of first conductive elements including an MIM bottom electrode plate and first and second TFR heads are formed in a first metal layer. A TFR element is formed conductively connected to both the first and second TFR heads. An insulator layer is formed above the first metal layer to define an MIM insulator and a TFR insulator cap over the TFR element. A plurality of second conductive elements are formed in a second metal layer above the first metal layer, the plurality of second conductive elements including an MIM top electrode. The MIM insulator is formed between the MIM bottom electrode plate and the MIM top electrode.

In one embodiment, the method further includes forming multiple vertically-extending MIM bottom electrode cup sidewalls above the MIM bottom electrode plate, wherein the MIM insulator includes multiple vertically-extending insulator sidewalls, each formed adjacent a respective vertically-extending MIM bottom electrode cup sidewall.

In one embodiment, the method further includes, after forming the plurality of conductive elements in the first metal layer and before forming the TFR element, concurrently forming: (a) vertically-extending MIM bottom electrode cup sidewalls above the MIM bottom electrode plate, and (b) a first TFR contact via conductively connected to the first TFR head and a second TFR contact via conductively connected to the second TFR head. The TFR element is conductively connected to the first TFR head through the first TFR contact via and conductively connected to the second TFR head through the second TFR contact via.

In one embodiment, the plurality of second conductive elements further includes an MIM bottom electrode connection pad connected to the MIM bottom electrode plate by at least one MIM bottom electrode connection pad via.

In one embodiment, the method further includes, after forming the plurality of conductive elements in the first metal layer and before forming the TFR element, concurrently forming: (a) vertically-extending MIM bottom electrode cup sidewalls above the MIM bottom electrode plate, and (b) a first TFR contact via conductively connected to the first TFR head and a second TFR contact via conductively connected to the second TFR head, and (c) the at least one MIM bottom electrode connection pad via.

In one embodiment, the method further includes forming an MIM bottom electrode cup on the MIM bottom electrode plate, including a laterally-extending bottom electrode cup base formed on the MIM bottom electrode plate and multiple vertically-extending MIM bottom electrode cup sidewalls. The MIM insulator and the MIM top electrode are formed at least partially in an interior volume of the MIM bottom electrode cup.

In one embodiment, the plurality of first conductive elements further includes a lower interconnect wire, and the plurality of second conductive elements further includes an upper interconnect wire connected to the lower interconnect wire by at least one interconnect via.

In one embodiment, forming the TFR element comprises forming and patterning a TFR layer to form (a) the TFR element, and (b) a TFR layer region above the MIM bottom electrode plate. The MIM insulator is then formed on the TFR layer region formed above the MIM bottom electrode plate.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present disclosure provide an integrated circuit (IC) structure including a three-dimensional (3D) MIM capacitor and a thin-film resistor (TFR) formed concurrently, and methods of forming such integrated circuit structure. In some embodiments the MIM capacitor and TFR are formed concurrently with an interconnect structure, e.g., using components of shared material layers. For example, a first common metal layer may be patterned to form selected lower components of the interconnect structure, MIM capacitor, and TFR, and a second common metal layer may be patterned to form selected upper components of the interconnect structure, MIM capacitor, and TFR. A common via layer may be deposited to form interconnect vias, a cup-shaped component of the MIM capacitor bottom electrode, and a pair of TFR contact vias for the TFR, and a common insulator layer may be patterned to form both an insulator for the MIM capacitor and an insulator cap over the TFR element.

Figure 1:
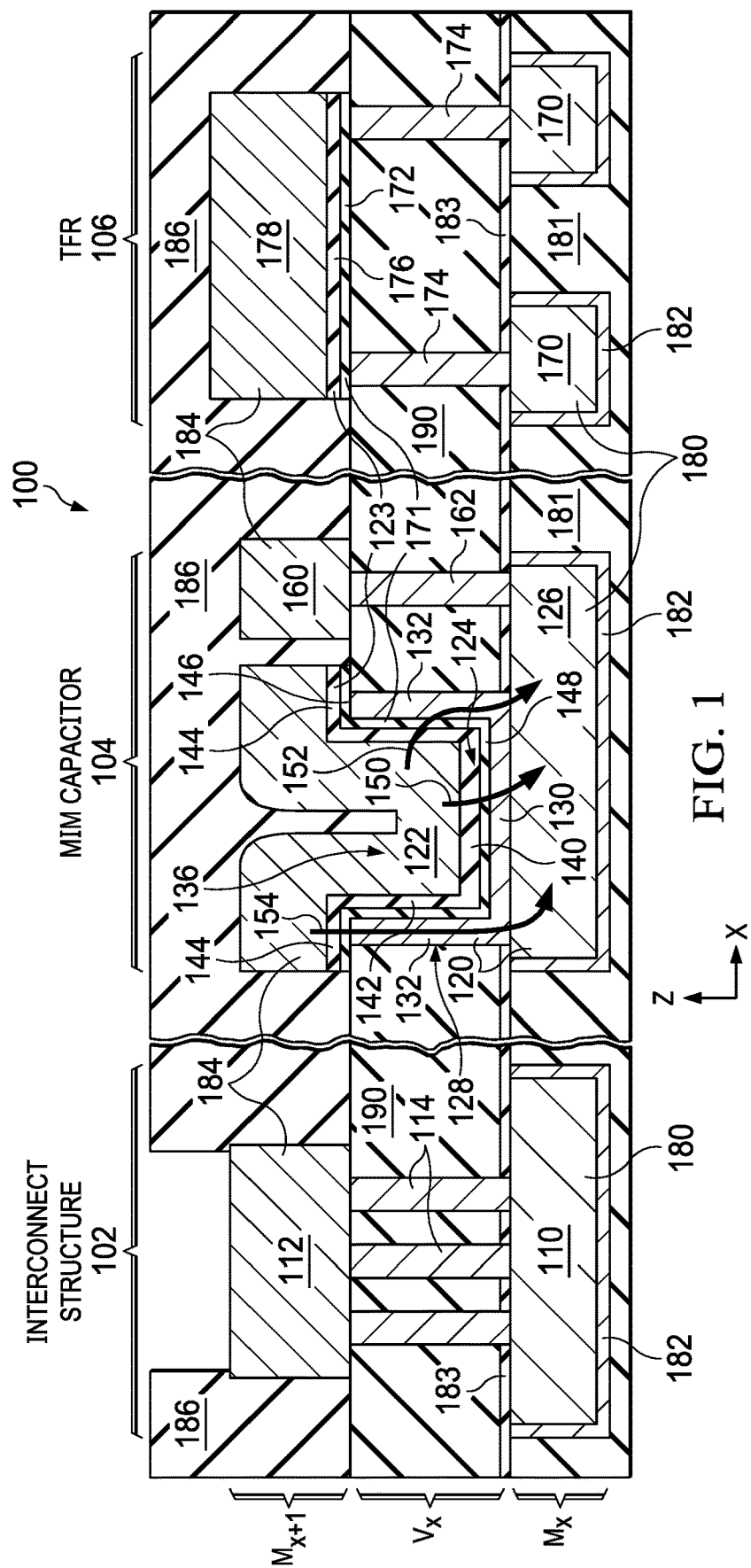
FIG. 1 shows a cross-sectional view of an example integrated circuit structure including an interconnect structure, an MIM capacitor, and a TFR formed concurrently using shared material layers, according to one example embodiment.

FIG. 1 shows a cross-sectional view of an example IC structure 100 including (a) an interconnect structure 102, (b) an MIM capacitor 104, and (c) a TFR 106 formed concurrently using shared material layers, according to one example embodiment.

The interconnect structure 102 may include a lower interconnect wire 110 formed in a first metal layer $M_x$ and an upper interconnect wire 112, e.g., an interconnect bond pad, formed in a second metal layer $M_{x+1}$ and connected to the lower interconnect wire 110 by at least one interconnect via 114 formed in a via layer $V_x$. Second metal layer $M_{x+1}$ is formed above first metal layer $M_x$.

The MIM capacitor 104 includes an MIM bottom electrode 120, an MIM top electrode 122, and an MIM insulator 124 sandwiched between the MIM bottom electrode 120 and the MIM top electrode 122. The MIM bottom electrode 120 includes (a) a bottom electrode plate 126 formed in the first metal layer $M_x$ and (b) a bottom electrode cup 128 formed on the bottom electrode plate 126. The bottom electrode cup 128 includes a laterally-extending bottom electrode cup base 130 and multiple vertically-extending bottom electrode cup sidewalls 132 extending upwardly from the laterally-extending bottom electrode cup base 130. The bottom electrode cup base 130 may have a rectangular perimeter (e.g., having a square or non-square rectangular shape) defining four lateral sides when viewed from above, with four vertically-extending bottom electrode cup sidewalls 132 extending upwardly from the four lateral sides of the rectangular perimeter, as better illustrated in FIGS. 5A-5B discussed below. As another example, the bottom electrode cup 128 may include two vertically-extending bottom electrode cup sidewalls 132 extending upwardly from two opposing lateral sides of the bottom electrode cup base 130, for example the two bottom electrode cup sidewalls 132 visible in FIG. 1. The bottom electrode cup 128 may include any other number of vertically-extending bottom electrode cup sidewalls 132 extending upwardly from the bottom electrode cup base 130.

The laterally-extending bottom electrode cup base 130 and vertically-extending bottom electrode cup sidewalls 132 may define an interior volume 136 of the bottom electrode cup 128. As shown, the MIM insulator 124 may be formed over the bottom electrode cup 128 and extending into the interior volume 136 of the bottom electrode cup 128, such that the MIM insulator 124 is also cup-shaped. The cup-shaped MIM insulator 124 includes a laterally-extending insulator cup base 140 formed over the bottom electrode cup base 130 and multiple vertically-extending insulator sidewalls 142 extending upwardly from the laterally-extending insulator cup base 140, with each vertically-extending insulator sidewall 142 formed over (e.g., laterally adjacent) a respective bottom electrode cup sidewall 132. As shown, the cup-shaped MIM insulator 124 may also include an insulator top flange 144 extending laterally from each vertically-extending insulator sidewall 142 and over a top (distal) end 146 of a respective vertically-extending bottom electrode cup sidewall 132.

The MIM top electrode 122 may be formed in the second metal layer $M_{x+1}$ over the cup-shaped MIM insulator 124 and extending down into the interior volume 136 of the bottom electrode cup 128, such that the MIM top electrode 122 covers the insulator cup base 140, the multiple vertically-extending insulator sidewalls 142, and the insulator top flanges 144 of the cup-shaped MIM insulator 124.

As shown, a TFR layer region 148 may be formed between the bottom electrode cup 128 and the cup-shaped MIM insulator 124. The TFR layer region 148 may be formed from a common material layer as a TFR element 172 of TFR 106, for example by depositing and patterning a TFR layer 171 to concurrently define the TFR layer region 148 and TFR element 172, as discussed below with reference to FIGS. 6 and 7A-7B. The TFR layer 171 may comprise SiCCr (silicon carbide chromium), SiCr (silicon chromium), TaN (tantalum nitride), NiCr (nickel chromium), AlNiCr (aluminum-doped nickel chromium), or TiNiCr (titanium nickel chromium), for example.

The MIM capacitor 104 also includes a bottom electrode connection pad 160 formed in the second metal layer $M_{x+1}$ and connected to the bottom electrode plate 126 by at least one bottom plate contact via 162.

The MIM top electrode 122 is capacitively coupled to both the bottom electrode cup base 130 and the bottom electrode cup sidewalls 132 of the bottom electrode cup 128 (which bottom electrode cup 128 is conductively coupled to the bottom electrode plate 126), which defines a substantially larger area of capacitive coupling between the MIM top electrode 122 and MIM bottom electrode 120, as compared with conventional designs. In particular, MIM capacitor 104 defines the following capacitive couplings between the MIM top electrode 122 and MIM bottom electrode 120:

(a) capacitance coupling between the MIM top electrode 122 and MIM bottom electrode 120 by a displacement current path through the insulator cup base 140 and through the bottom electrode cup base 130, as indicted by arrow 150;

(b) capacitance coupling between the MIM top electrode 122 and MIM bottom electrode 120 by a displacement current path through each vertically-extending insulator sidewall 142 and through the corresponding vertically-extending bottom electrode cup sidewall 132, as indicated by arrow 152; and (c) capacitance coupling between the MIM top electrode 122 and MIM bottom electrode 120 by a displacement current path through each insulator top flange 144 and through the top (distal) end 146 of a respective bottom electrode cup sidewall 132, as indicated by arrow 154.

The laterally-extending insulator cup base 140 effectively defines a plate capacitor, with the top and bottom plates extending horizontally (x-y plane), and each vertically-extending insulator sidewall 142 effectively defines an additional plate capacitor, with the top and bottom plates extending vertically (x-z plane or y-z plane). Thus, MIM capacitor 104 may be referred to as a "three-dimensional" or "3D" MIM capacitor. MIM capacitor 104 defines a substantially increased area of capacitive coupling between the MIM top electrode 122 and MIM bottom electrode 120, e.g., as compared with conventional MIM capacitors.

Turning now to the TFR 106, the TFR 106 includes a pair of TFR heads 170 formed in the first metal layer $M_x$ and a TFR element 172 connected to each TFR head 170 by a TFR contact via 174 (or alternatively, by multiple TFR contact vias 174). As discussed below with reference to FIGS. 5A-5B, each TFR contact via 174 may be formed as an elongated via, in particular elongated in a direction extending into the page, to provide a predictable and consistent contact area between each lateral end of the TFR element 172 and a respective TFR contact via 174.

A TFR insulator cap 176 may be formed over the TFR element 172, to protect the TFR element from damage during TFR formation. The TFR insulator cap 176 may be formed from a common material layer as the MIM insulator 124, for example by depositing, patterning, and etching an insulator layer 123 to concurrently define the MIM insulator 124 and TFR insulator cap 176, as discussed below with reference to FIGS. 6 and 7A-7B. A TFR metal cap 178 may be formed in the second metal layer $M_{x+1}$ over the TFR insulator cap 176, as shown.

As shown, the lower interconnect wire 110, the bottom electrode plate 126, and the pair of TFR heads 170 may each comprise a conductive element 180 formed concurrently in the first metal layer $M_x$, e.g., a metal interconnect layer. A barrier layer 183, e.g., SiN, SiC, or a low-k dielectric material may be formed over the first metal layer $M_x$, e.g., to protect against corrosion and diffusion from conductive elements 180. Conductive elements 180 may be metal elements comprising copper, aluminum, or other metal. For example, conductive elements 180 may comprise copper damascene elements, each formed over a barrier layer 182 (e.g., tantalum/tantalum nitride (Ta/TaN) bilayer) in a respective trench. As another example, conductive elements 180 may be formed by depositing, patterning, and etching a metal layer (e.g., copper or aluminum). As another example, as discussed below with reference to FIG. 10, first metal layer $M_x$ may be a silicided polysilicon layer in which each conductive element 180 (including lower interconnect wire 110, the bottom electrode plate 126, and TFR heads 170) comprises a metal silicide region formed on a respective polysilicon region.

In addition, the upper interconnect wire 112, the MIM top electrode 122, the bottom electrode connection pad 160, and the TFR metal cap 178 may each comprise a conductive element 184 formed concurrently in the second metal layer $M_{x+1}$. Conductive elements 184 may comprise copper, aluminum, or other conductive metal. For example, conductive elements 184 may comprise aluminum elements formed in an aluminum bond pad layer. As another example, conductive elements 184 may comprise copper or aluminum elements formed in an interconnect layer at any depth in the integrated circuit structure 100. A passivation layer 186, e.g., comprising deposition of 1.1 µm thick silicon oxide formed by a high-density plasma (HDP) chemical vapor deposition process, followed by deposition of a 1 µm thick silicon oxynitride (SiON) film formed by a plasma enhanced chemical vapor deposition (PECVD) process, may be formed over the conductive elements 184, and etched to expose upper interconnect wire 112, e.g., where upper interconnect wire 112 is formed as a bond pad.

Further, interconnect vias 114, bottom electrode cup 128, bottom plate contact via 162, and TFR contact vias 174 may be formed concurrently in an inter-metal dielectric (IMD) region 190 comprising, for example, silicon dioxide $SiO_2$ or a low-k dielectric material, e.g., having a dielectric constant less than 3.6. For example, interconnect vias 114, bottom electrode cup 128, bottom plate contact via 162, and TFR contact vias 174 may be formed by depositing a common via layer into various openings formed in the IMD region 190, as discussed below regarding FIGS. 5A-5B.

FIGS. 2-9 show an example process for forming the example integrated circuit (IC) structure 100 shown in FIG. 1, including interconnect structure 102, MIM capacitor 104, and TFR 106. As discussed below, interconnect structure 102, MIM capacitor 104, and TFR 106 may be formed concurrently, using common layers (e.g., metal layer $M_x$ and metal layer $M_{x+1}$) to form components of interconnect structure 102, MIM capacitor 104, and TFR 106.

Figure 2:
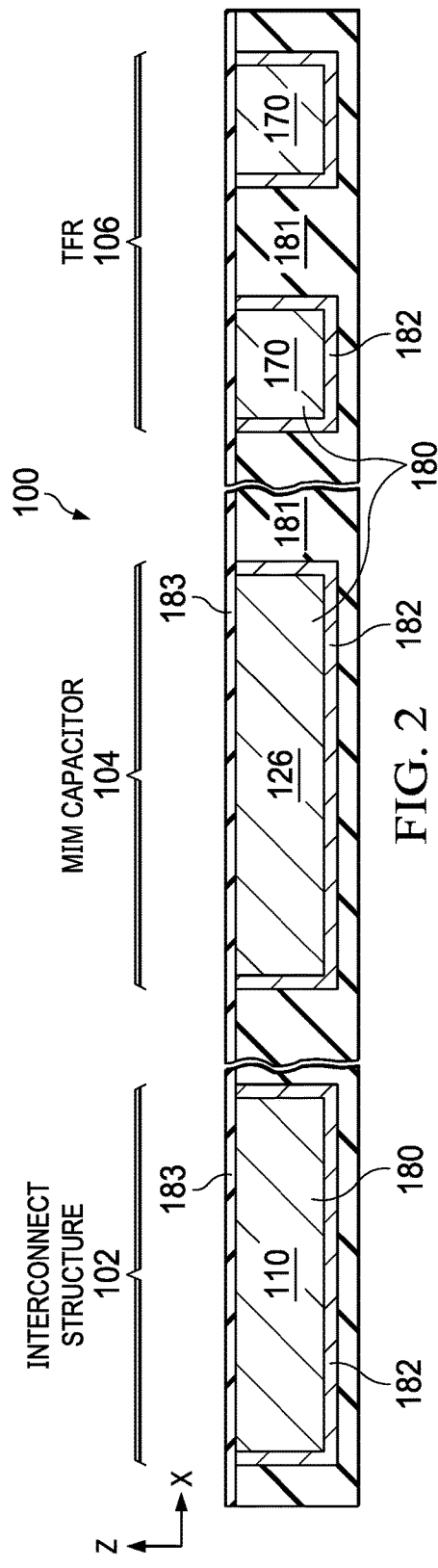
FIGS. 2-9 show an example process for forming the example integrated circuit structure shown in FIG. 1, according to one example embodiment.

First, as shown in FIG. 2, conductive elements 180 may be concurrently formed in metal layer $M_x$ in dielectric region 181. Conductive elements 180 may define (a) the lower interconnect wire 110 for the interconnect structure 102 being constructed, (b) the bottom electrode plate 126 for the MIM capacitor 104 being constructed, and (c) the pair of TFR heads 170 for the TFR 106 being constructed. Metal layer $M_x$ may comprise copper, aluminum, or other suitable metal. For some applications of the integrated circuit structure 100, e.g., radio frequency (RF) devices, metal layer $M_x$ be the top layer of copper interconnect, as is may be desirable to build the MIM capacitor 104 in the top metal layers (i.e., away from the silicon substrate of the wafer) to reduce noise.

Each conductive element 180 may be formed over a barrier layer 182 (e.g., a Ta/TaN bilayer) deposited in a respective trench opening. For example, the conductive elements 180 may be trench elements formed by a Cu damascene process in which the barrier layer 182 followed by Cu are deposited over dielectric region 181 and extending down into trench openings formed in dielectric region 181, followed by a chemical mechanical planarization (CMP) process to remove unwanted Cu at the top of the structure. Dielectric region 181 may include one or more dielectric materials, e.g., at least one of silicon oxide, fluorosilicate glass (FSG), organosilicate glass (OSG), porous OSG, or other low-k dielectric material, e.g., having a dielectric constant less than 3.6.

A dielectric barrier layer 183, e.g., comprising SiN or SiC, may be deposited after the CMP process, e.g., to protect the exposed top surfaces of metal structures 180 from oxidation or corrosion.

Figure 3A:
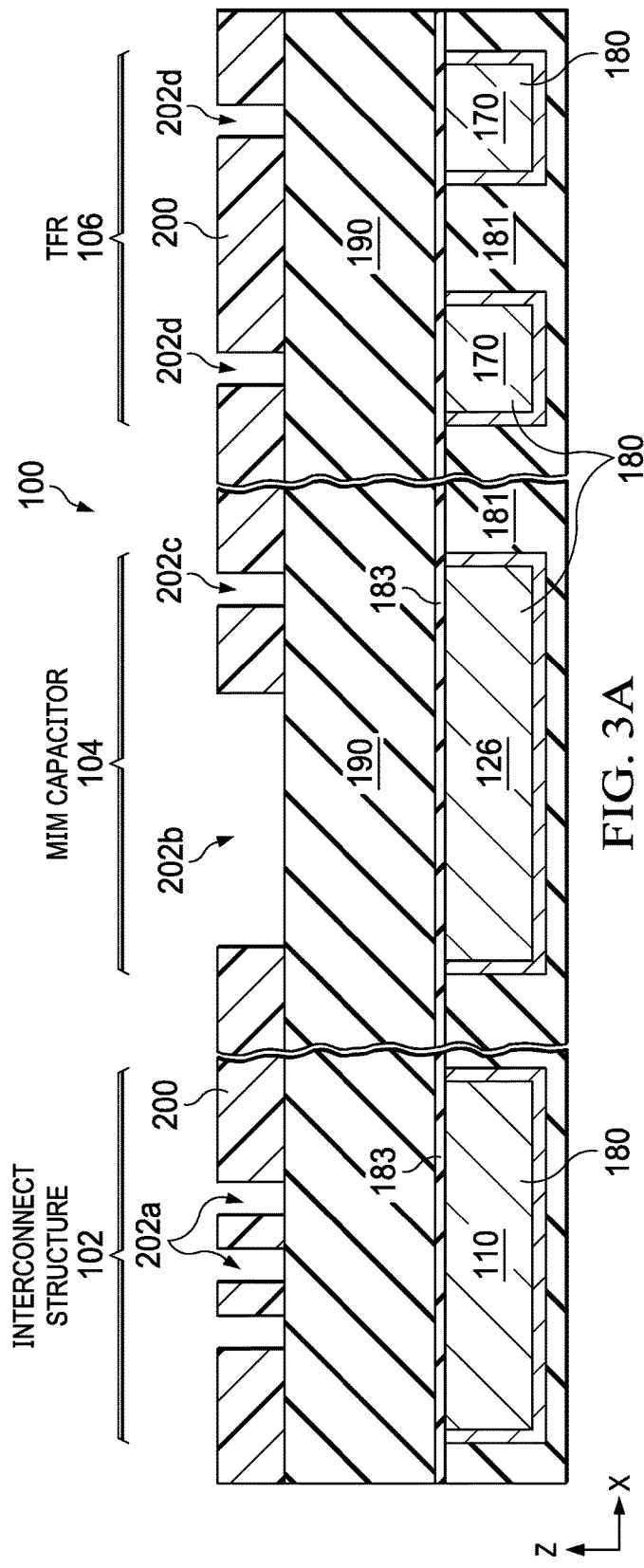
Figure 3B:
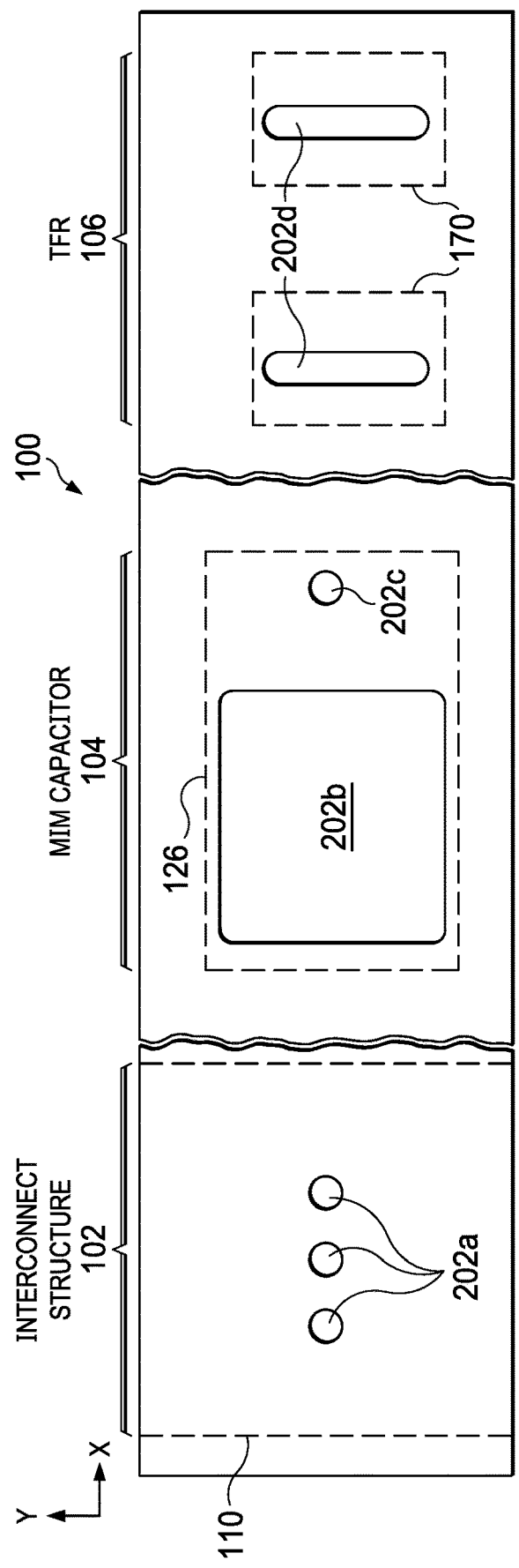

Next, as shown in FIG. 3A (cross-sectional side view) and FIG. 3B (top view), IMD region 190 may be deposited on the structure, followed by deposition and patterning of a photoresist layer 200 over the IMD region 190. IMD region 190 may include one or more dielectric materials, e.g., at least one of silicon oxide, FSG, OSG, porous OSG, or other low-k dielectric material. The photoresist layer 200 may be deposited on the IMD region 190 and patterned to simultaneously define various mask openings 202a-202d, including interconnect via mask openings 202a, an MIM tub mask opening 202b, an MIM contact via mask opening 202c, and a pair of TFR contact via mask openings 202d.

As shown in the top view of FIG. 3B, interconnect via mask openings 202a may have a circular or oval shape, MIM tub mask opening 202b may have a square or rectangular shape with rounded corners, MIM contact via mask opening 202c may have a circular or oval shape, and TFR contact via mask openings 202d may have an elongated shape with rounded corners. The rounded shapes or corners of mask openings 202a-202d may improve a breakdown voltage for the structures being formed using mask openings 202a-202d.

Figure 4A:
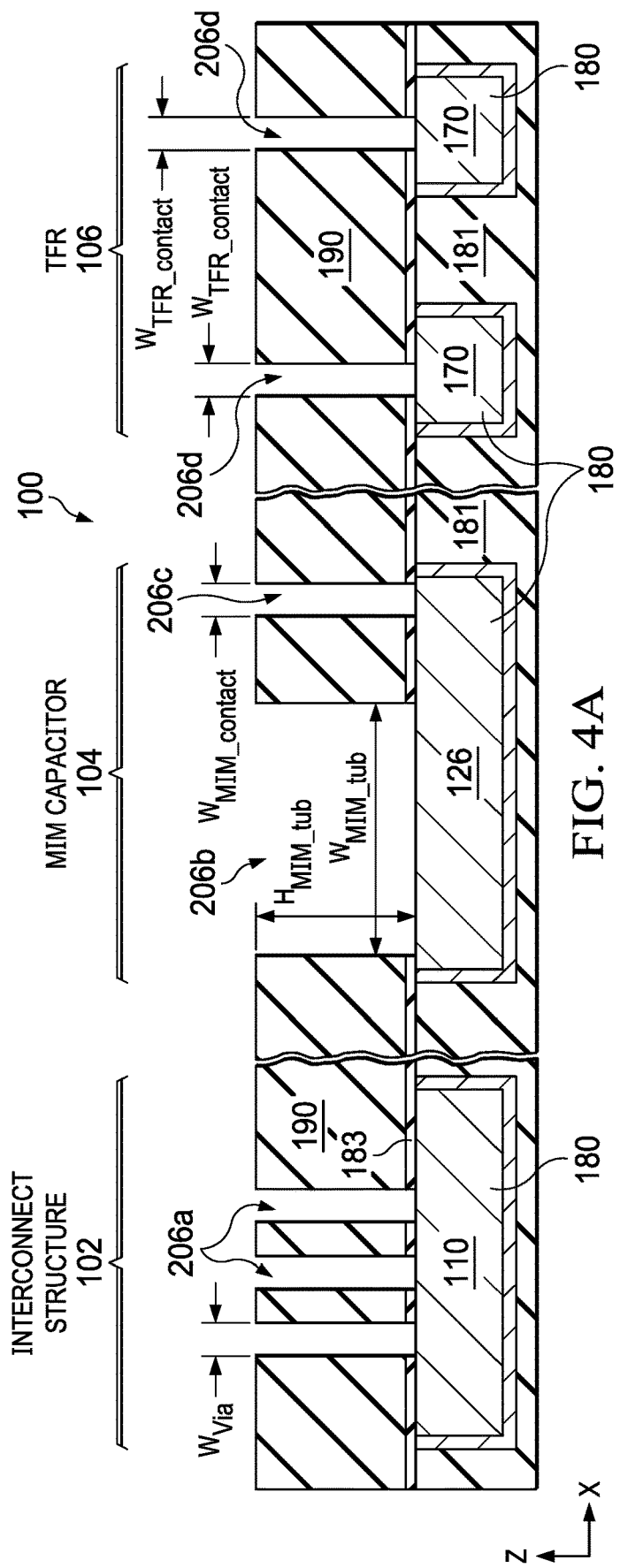
Figure 4B:
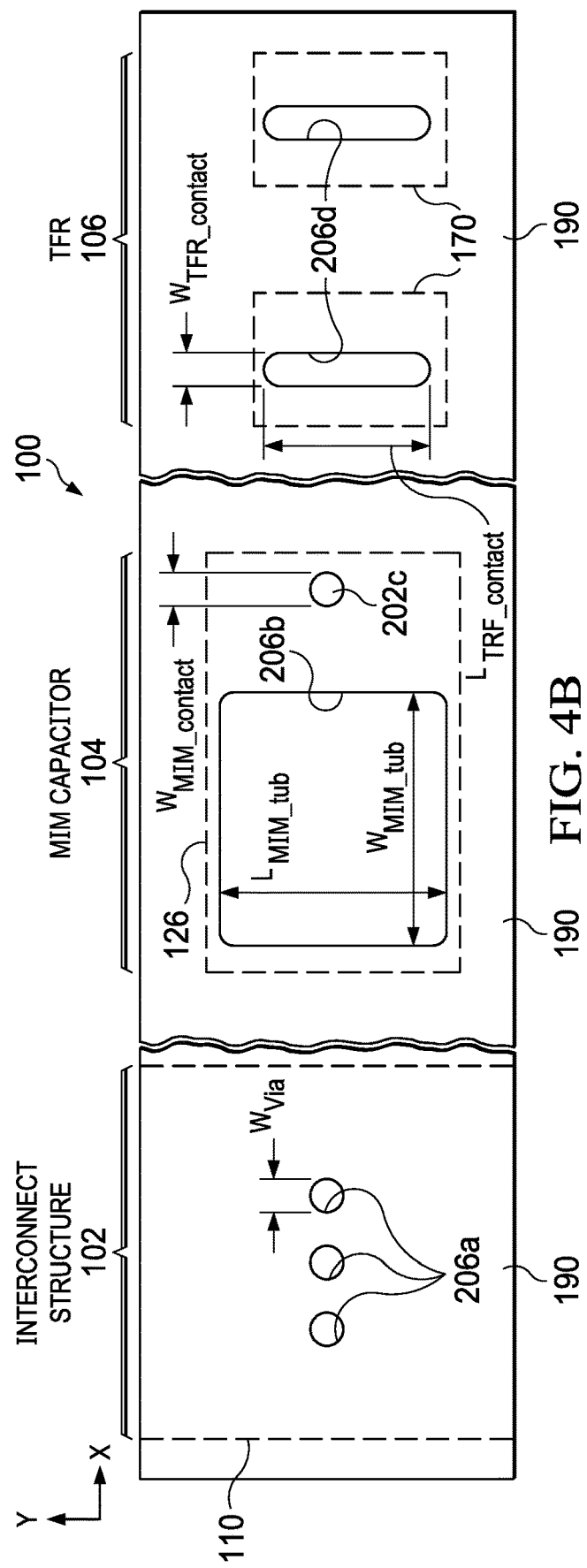

Next, as shown in FIG. 4A (cross-sectional side view) and FIG. 4B (top view), the IMD region 190 may be etched through the mask openings 202a-202d shown in FIGS.

3A-3B to concurrently form corresponding IMD openings 206a-206d, including (a) interconnect via openings 206a for forming interconnect vias 114, (b) an MIM tub opening 206b for forming bottom electrode cup 128, cup-shaped MIM insulator 124, and MIM top electrode 122, (c) an MIM contact via opening 206c for forming bottom plate contact via 162, and (d) a pair of TFR contact via openings 206d for forming TFR contact vias 174. IMD opening 206a-206d may be formed using a plasma etch or other suitable etch, followed by a resist strip or other suitable process to remove remaining portions of photoresist layer 200. Mask openings 202a-202d shown in FIGS. 3A-3B may be shaped and sized to produce a specified shape and size for the corresponding IMD opening 206a-206d shown in FIGS. 4A-4B.

With respect to interconnect structure 102, the interconnect via openings 206a may be via openings having a width (or diameter) $W_{via}$ in the range of 0.1-0.5 μm, for example. The interconnect width $W_{via}$ may significantly affect the performance of the IC device being formed.

With respect to MIM capacitor 104, MIM contact via opening 206c may be formed as a via opening with a width $W_{MIM\_contact}$. In some embodiments, MIM contact via opening 206c is formed the same as an interconnect via openings 206a, thus having the same width $W_{via}$. In contrast, MIM tub opening 206b may have a substantially larger width (x-direction) and/or length (y-direction) than interconnect via openings 206a and MIM contact via opening 206c. The shape and dimensions of the MIM tub opening 206b may be selected based on various parameters, e.g., for effective manufacturing of the MIM capacitor 104 (e.g., effective deposition of the top plate material (e.g., aluminum) into the MIM tub opening 206b) and/or for desired performance characteristics of the resulting MIM capacitor 104. As shown in FIG. 4B, the MIM tub opening 206b may have a square or rectangular shape from the top view. In other embodiments, MIM tub opening 206b may have a circular or oval shape from the top view.

As noted above, an x-direction width $W_{MIM\_tub}$ and/or y-direction length $L_{MIM\_tub}$ of MIM tub opening 206b may be substantially larger than the width $W_{via}$ of via openings 206a. For example, in some embodiments, the width $W_{MIM\_tub}$ and/or length $L_{MIM\_tub}$ of MIM tub opening 206b is at least twice as large as the width $W_{via}$ of via openings 206a. In particular embodiments, the width $W_{MIM\_tub}$ and/or length $L_{MIM\_tub}$ of MIM tub opening 206b is at least five time as large as the width $W_{via}$ of via openings 206a. In some embodiments, the width $W_{MIM\_tub}$ and length $L_{MIM\_tub}$ of MIM tub opening 206b are each the range of 1-10 μm.

Further, MIM tub opening 206b may be formed with a height-to-width aspect ratio ($H_{MIM\_tub}/W_{MIM\_tub}$) of less than or equal to 2.0 and/or a height-to-length aspect ratio ($H_{MIM\_tub}/L_{MIM\_tub}$) of less than or equal to 2, e.g., to allow effective filling of the MIM tub opening 206b by conformal materials. For example, MIM tub opening 206b may be formed with aspect ratios $H_{MIM\_tub}/W_{MIM\_tub}$ and $H_{MIM\_tub}/L_{MIM\_tub}$ each in the range of 0.1-2.0, for example in the range of 0.5-2.0. In some embodiments, aspect ratios $H_{MIM\_tub}/W_{MIM\_tub}$ and $H_{MIM\_tub}/L_{MIM\_tub}$ are each less than or equal to 1.5, e.g., for effective filling of MIM tub opening 206b by conformal materials, e.g., aluminum. For example, MIM tub opening 206b may be formed with aspect ratios $H_{MIM\_tub}/W_{MIM\_tub}$ and $H_{MIM\_tub}/L_{MIM\_tub}$ in the range of 0.5-1.5, or more particularly in the range of 0.8-1.2.

With respect to TFR 106, TFR contact via openings 206d may be formed as elongated or "slotted" via openings, which may be laterally elongated in the y-direction such that the y-direction length $L_{TFR\_contact}$ of each TFR contact via opening 206d is at least 2 times, at least 5 times, at least 10, at least 20 times, at least 50 times, or at least 100 times the x-direction width $W_{TFR\_contact}$. In some embodiments, TFR contact via opening 206d is formed as an elongated version of an interconnect via opening 206a, with a width $W_{TFR\_contact}$ equal to the interconnect via width $W_{via}$ and a length $L_{TFR\_contact}$ at least 2 times, at least 5 times, at least 10, at least 20 times, at least 50 times, or at least 100 times the interconnect via width $W_{via}$. For example, each TFR contact via opening 206d may have a width $W_{TFR\_contact}$ in the range of 0.1-0.5 μm and a length $L_{TFR\_contact}$ in the range of 1-100 μm.

Figure 5A:
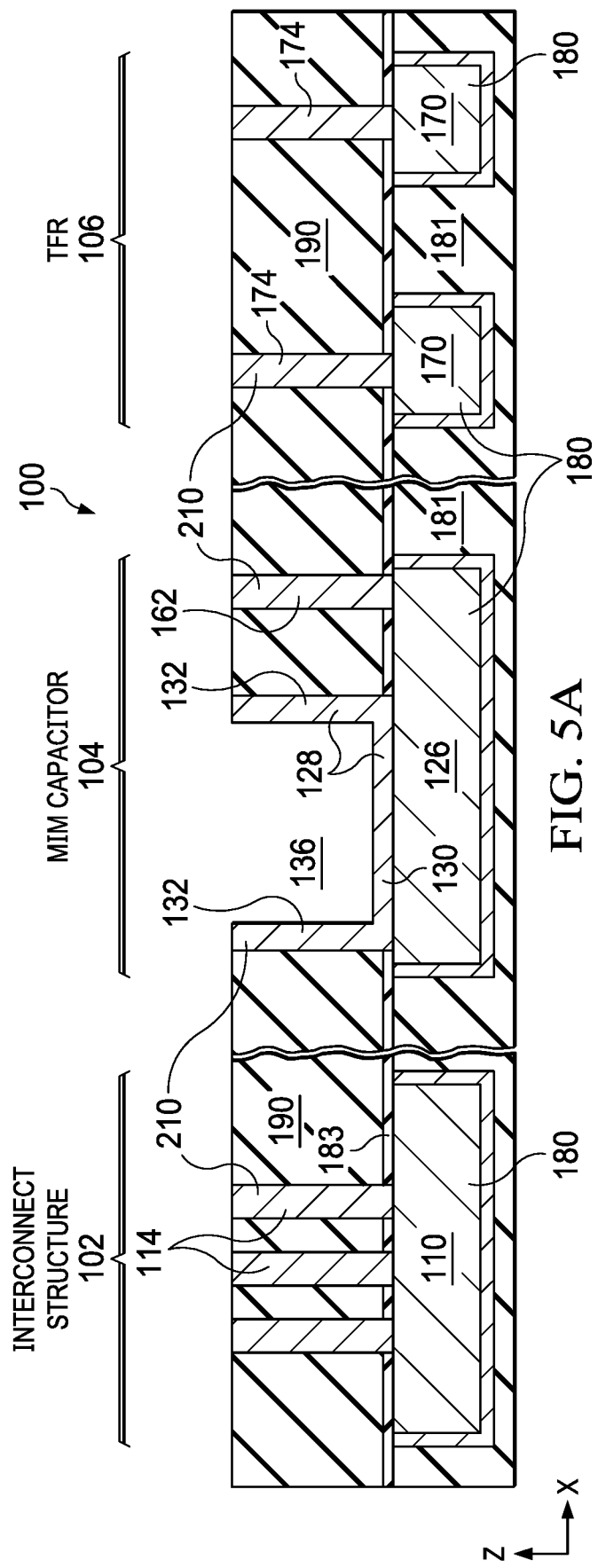
Figure 5B:
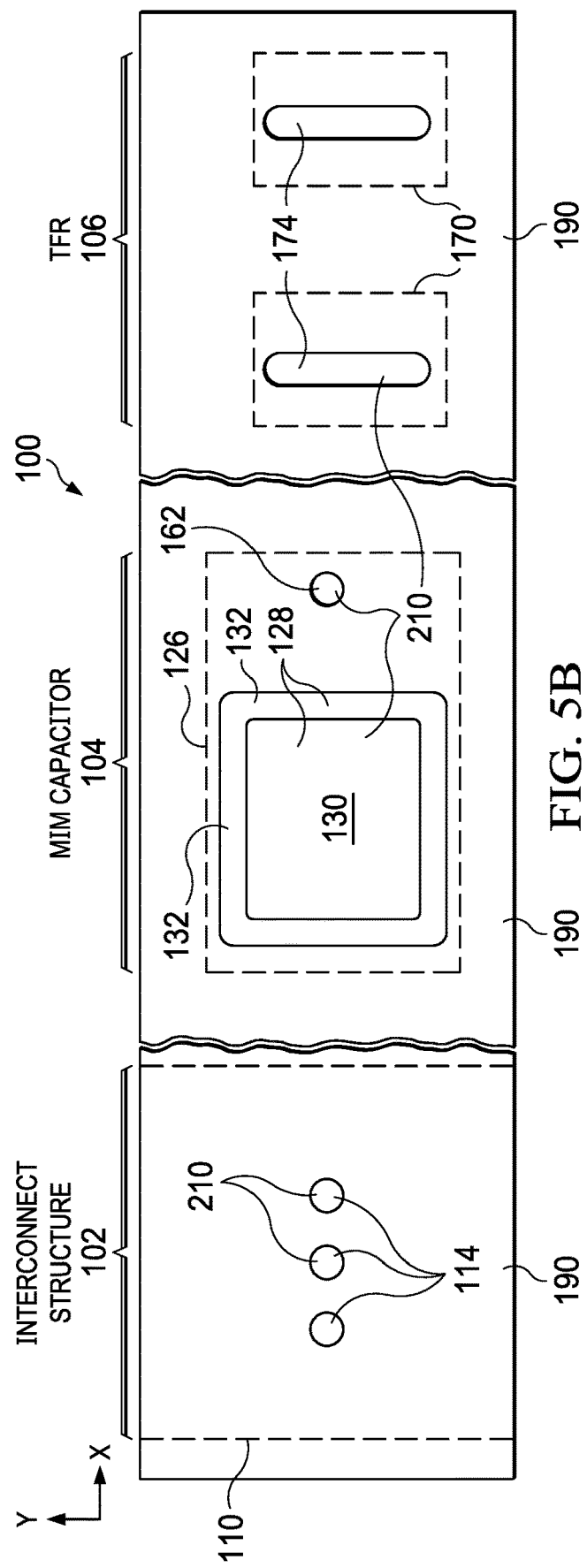

Next, as shown in FIG. 5A (cross-sectional side view) and FIG. 5B (top view), a via layer 210 comprising a conductive conformal material, e.g., W, TiN, or other conformal metal, is deposited over the structure 100 and extending down into each IMD opening 206a-206d, followed by a CMP process to remove upper portions of the via layer 210, including portions deposited on top of IMD region 190. The via layer 210 may be deposited by chemical vapor deposition (CVD) or other suitable deposition process. FIGS. 5A and 5B show the structure after the CMP.

As shown, the deposited via layer 210 (a) fills interconnect via openings 206a to form interconnect vias 114, (b) covers the interior surfaces of MIM tub opening 206b to form the bottom electrode cup 128 defining an interior volume 136, (c) fills MIM contact via opening 206c to form bottom plate contact via 162, and (d) fills TFR contact via openings 206d to form TFR contact vias 174. As discussed above, the bottom electrode cup 128 includes four multiple vertically-extending bottom electrode cup sidewalls 132 extending upwardly from the laterally-extending bottom electrode cup base 130.

Figure 6:
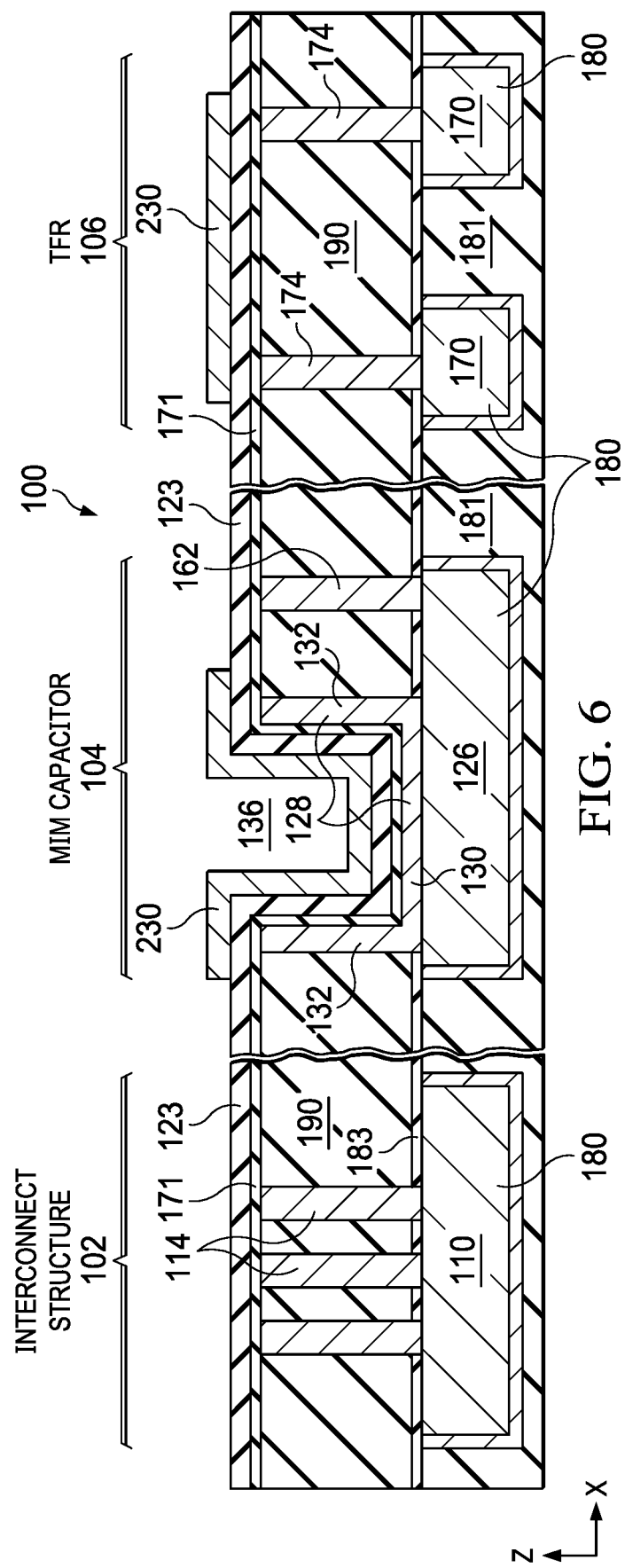

Next, as shown in FIG. 6, the process may continue by depositing a TFR layer 171, followed by deposition of an insulator layer 123, followed by deposition and patterning of a photoresist layer, to form photomask 230. As shown, the TFR layer 171, insulator layer 123, and photomask 230 may each extend down into the interior volume 136 of the bottom electrode cup 128.

TFR layer 171 may comprise a thin film, e.g., having a thickness in the range of 50 Å-200 Å, comprising SiCCr, SiCr, TaN, NiCr, AlNiCr, or TiNiCr, for example. Insulator layer 123 may comprise SiN, having a thickness in the range of 200 Å-1000 Å, or about 500 Å, which may act as an MIM insulator for MIM capacitor 104, and also as a protective TFR cap for TFR 106, as discussed below regarding FIGS. 7A-7B. In other embodiments, insulator layer 123 may include a high-k dielectric material, i.e. having a dielectric constant greater than 3.6, e.g., $Al_2O_3$, $ZrO_2$, $HfO_2$, $ZrSiO_x$, $HfSiO_x$, $HfAlO_x$, or $Ta_2O_5$, deposited by atomic layer deposition (ALD) or other suitable deposition process.

Figure 7A:
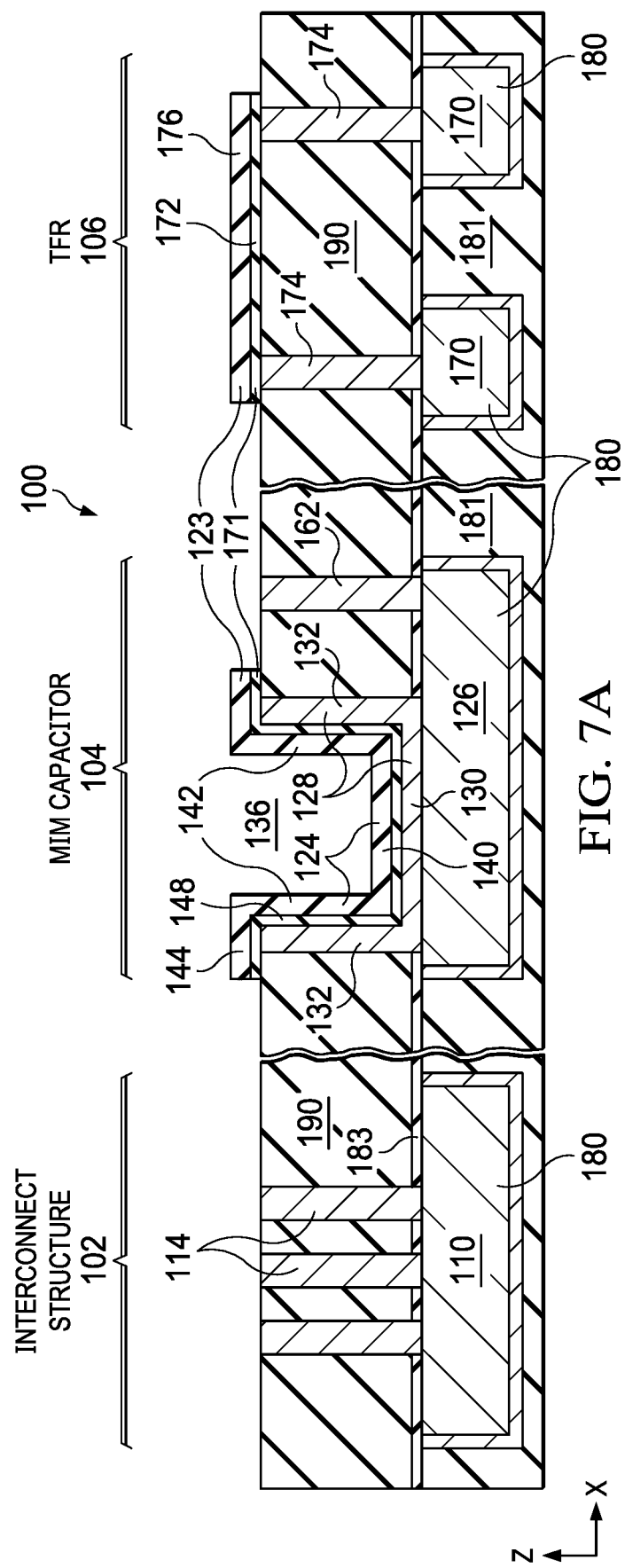
Figure 7B:
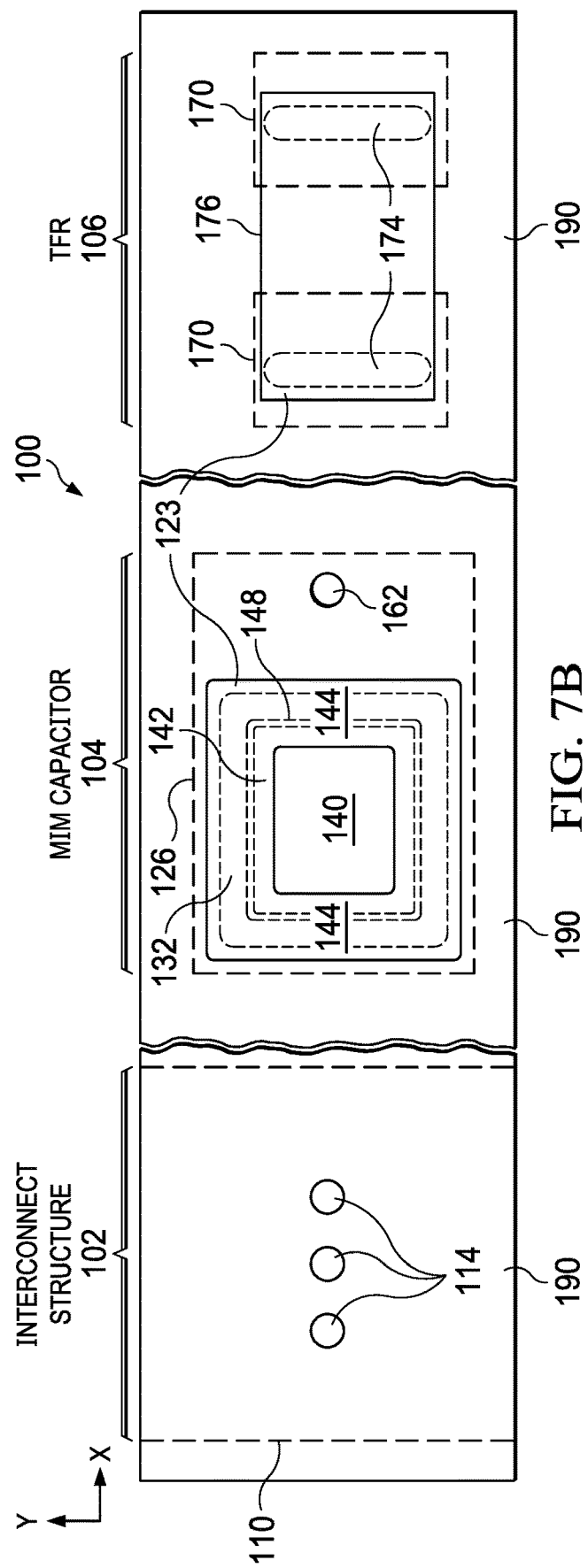

Next, as shown in FIG. 7A (cross-sectional side view) and FIG. 7B (top view), an etch is performed to remove portions of insulator layer 123 and underlying TFR layer 171 not protected by photomask 230 (shown in FIG. 6), and remaining portions of photomask 230 may then be removed by a resist strip or other suitable removal process. The resulting portions of TFR layer 171 define the TFR element 172 of TFR 106 and the TFR layer region 148 of MIM capacitor 104. The resulting portions of insulator layer 123 define the cup-shaped MIM insulator 124 of MIM capacitor 104 and the TFR insulator cap 176 over the TFR element 172. The MIM insulator 124 is cup-shaped and includes four vertically-extending insulator sidewalls 142 extending upwardly from the laterally-extending insulator cup base 140, and an insulator top flange 144 extending laterally from a top of each vertically-extending insulator sidewall 142.

Figure 8:
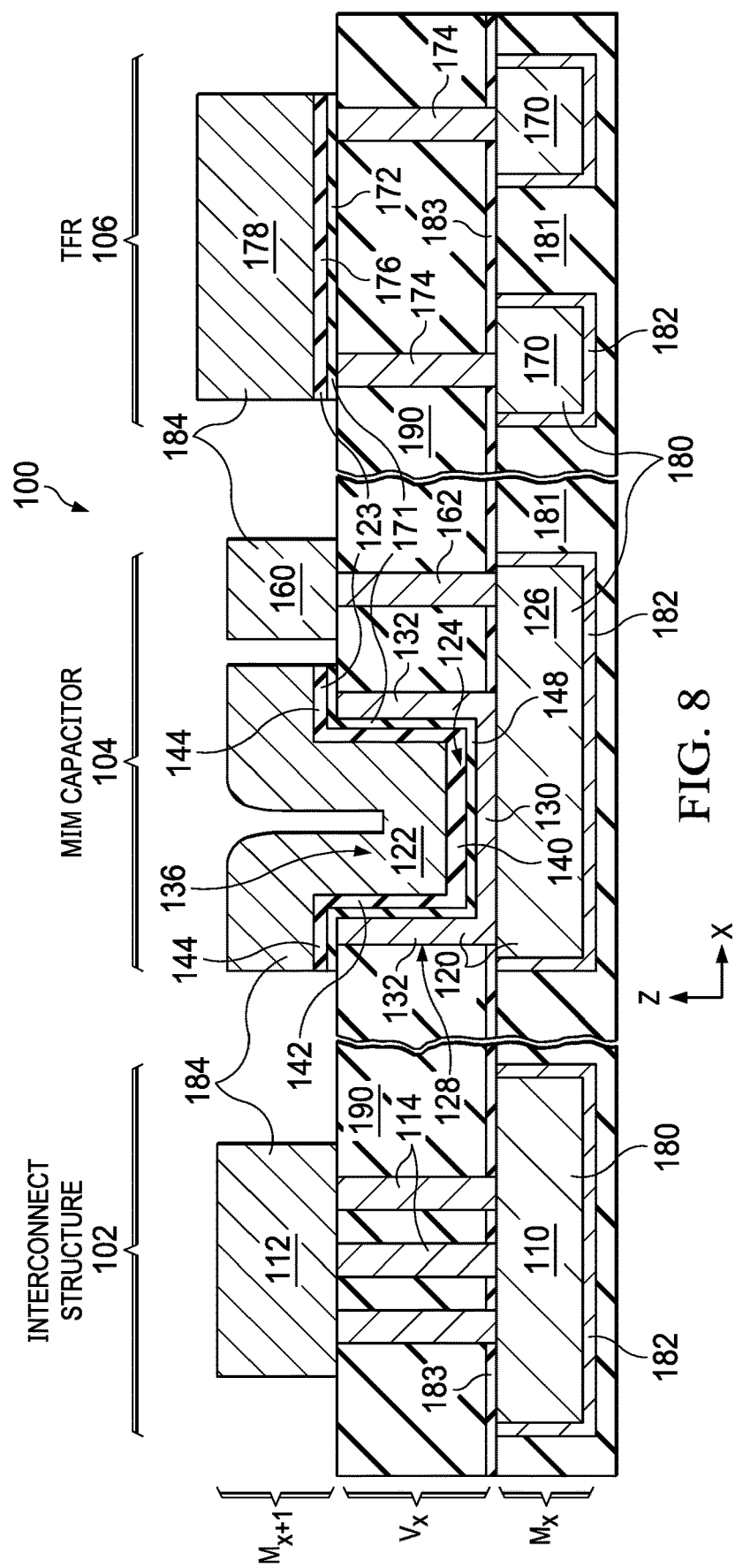

Next, as shown in FIG. 8, multiple conductive elements 184 may be concurrently formed in metal layer $M_{x+1}$ (i.e., defined by portions of metal layer $M_{x+1}$) formed over IMD region 190. Conductive elements 184 may include the upper interconnect wire 112 for interconnect structure 102, the MIM top electrode 122 and bottom electrode connection pad 160 of MIM capacitor 104, and the TFR metal cap 178 formed over the TFR insulator cap 176 and underlying TFR element 172.

To form conductive elements 184, metal layer $M_{x+1}$, for example comprising aluminum, copper, or other metal, is deposited on the structure 100 and extending down into the interior volume 136 of the bottom electrode cup 128. Metal layer $M_{x+1}$ may then be patterned (e.g., using a photoresist) and etched to define conductive elements 184, including upper interconnect wire 112, MIM top electrode 122, bottom electrode connection pad 160, and TFR metal cap 178. In other embodiments, metal layer $M_{x+1}$ may be an interconnect layer (e.g., copper or aluminum interconnect) formed at any depth in the integrated circuit structure 100.

Figure 9:
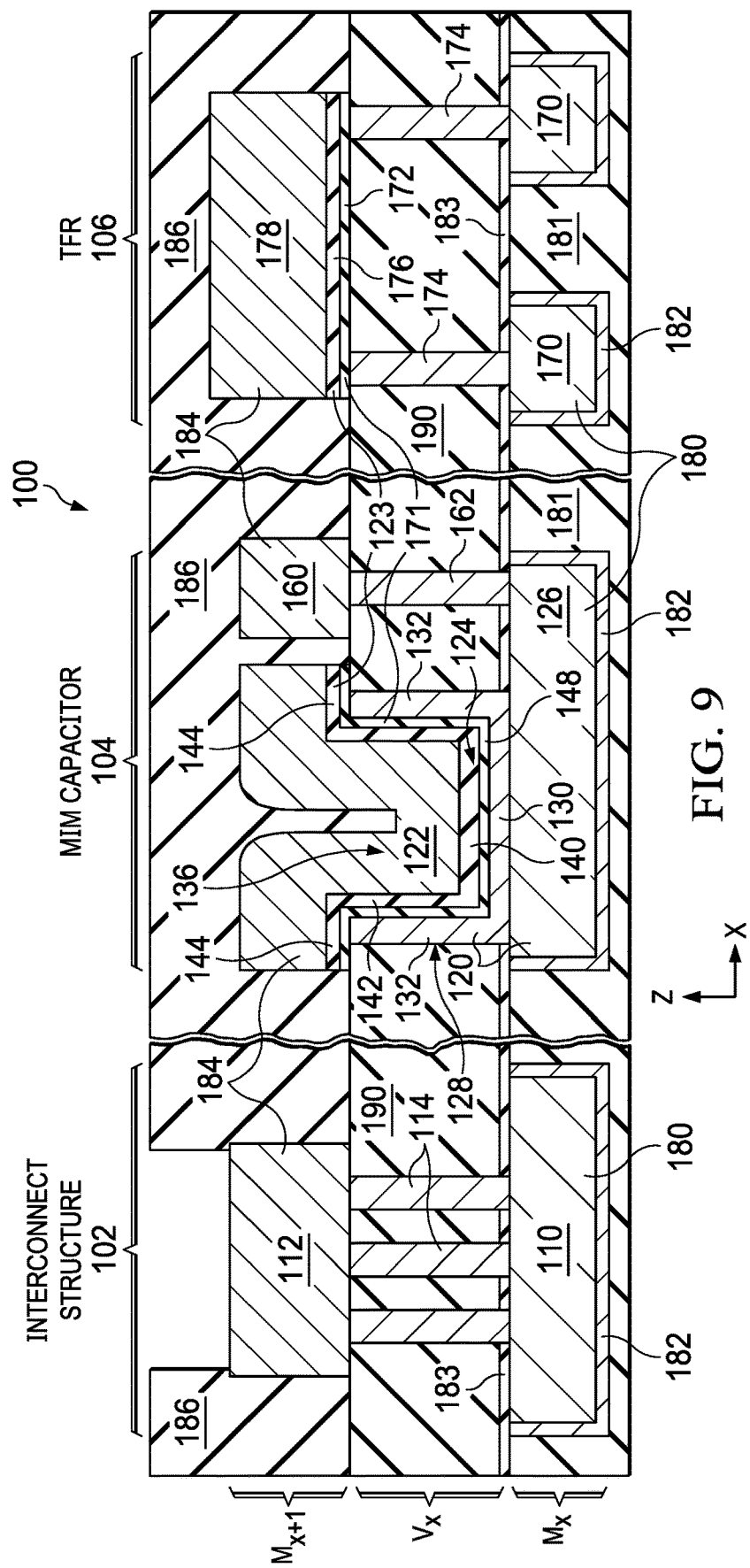

Next, as shown in FIG. 9, a passivation layer 186 may be formed over the conductive elements 184 formed in metal layer $M_{x+1}$. Passivation layer 186 may be formed as a multi-layer deposition, e.g., comprising deposition of 1.1 μm thick silicon oxide by a high-density plasma (HDP) chemical vapor deposition process, followed by deposition of a 1 μm thick silicon oxynitride (SiON) film by a plasma enhanced chemical vapor deposition (PECVD) process. Passivation layer 186 may then be patterned and etched to expose the upper interconnect wire 112, e.g., in embodiments in where the upper interconnect wire 112 acts as a bond pad.

As discussed above, IC structure 100 may be formed between any two metal layers $M_x$ and $M_{x+1}$ (each comprising copper, aluminum, or other metal), wherein first conductive elements 180 defining first components of interconnect structure 102, MIM capacitor 104, and TFR 106 are formed in metal layer $M_x$, and second conductive elements 184 defining second components of interconnect structure 102, MIM capacitor 104, and TFR 106 are formed in metal layer $M_{x+1}$. In the example shown in FIGS. 1-9 discussed above, conductive elements 180 in metal layer $M_x$ may be formed by a damascene process (e.g., to form copper damascene elements). As another example, conductive elements 180 in metal layer $M_x$ may be formed by depositing, patterning, and etching a metal layer, e.g., comprising copper or aluminum. As another example, as discussed below with reference to FIG. 10, metal layer $M_x$ may be a silicided polysilicon layer in which each conductive element 180 (including interconnect element 110, bottom electrode plate 126, and TFR heads 170) comprises a metal silicide region formed on a respective polysilicon region.

Figure 10:
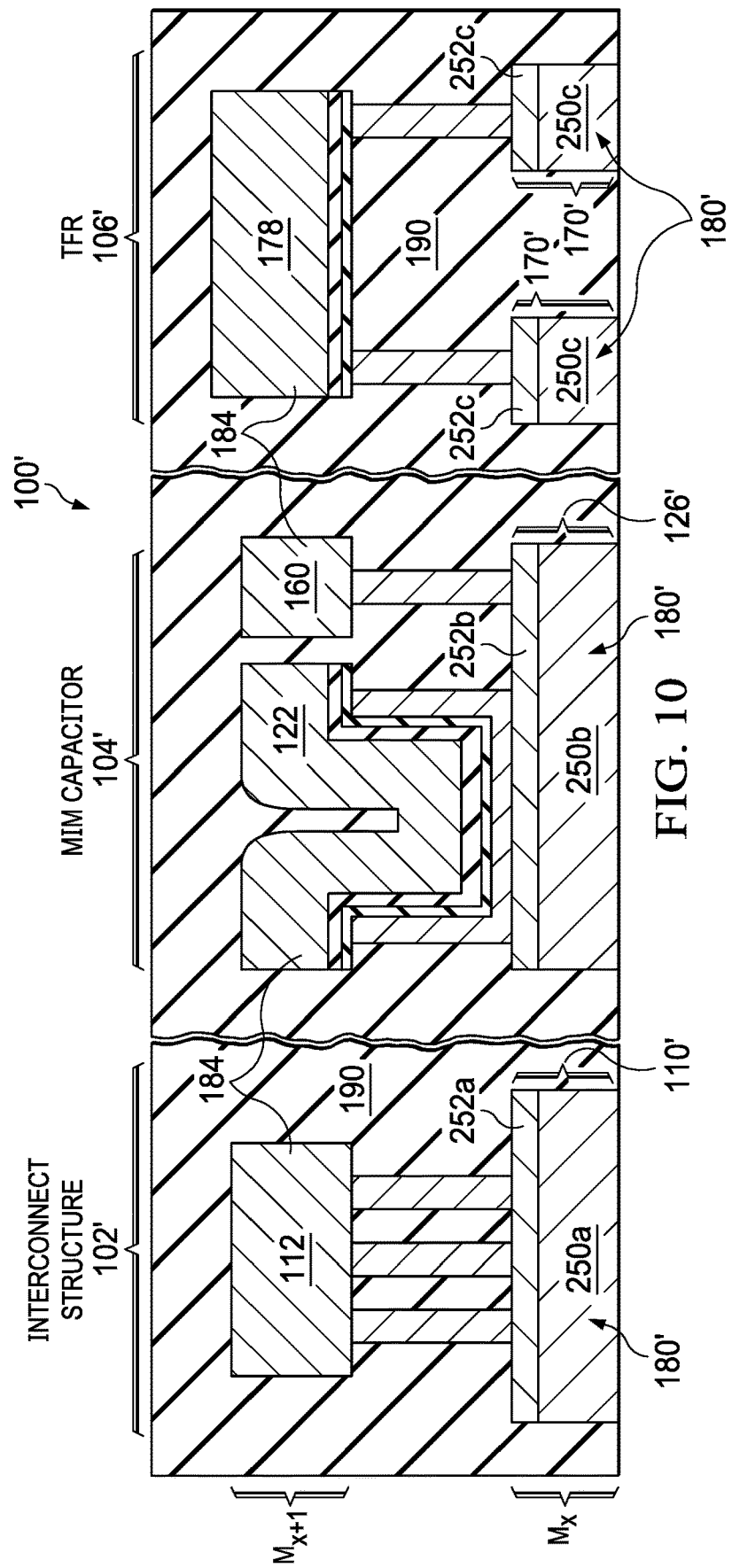
FIG. 10 shows a cross-sectional side view of an example integrated circuit structure similar to the example structure shown in FIG. 1, wherein selected lower elements of the interconnect structure, MIM capacitor, and TFR are formed as silicided polysilicon elements, according to one example embodiment.

FIG. 10 shows a cross-sectional side view of an example IC structure 100' similar to the example IC structure 100 discussed above, and wherein the lower metal layer $M_x$ comprises a silicided polysilicon layer, according to one example embodiment. IC structure 100' includes interconnect structure 102', MIM capacitor 104', and TFR 106', which may be similar to interconnect structure 102, MIM capacitor 104, and TFR 106 of IC structure 100 discussed above except for the construction of conductive elements 180' formed in the lower metal layer $M_x$, including lower interconnect wire 110', bottom electrode plate 126', and TFR heads 170'. In particular, conductive elements 180' may be formed by depositing, patterning, and etching a polysilicon layer to define discrete polysilicon elements 250a-250c, followed by forming a conductive silicide region 252a-252c on each respective polysilicon element 250a-250c, e.g., by a self-aligned salicide process. Conductive silicide regions 252a-252c may comprise titanium silicide, cobalt silicide, or nickel silicide having a thickness in the range of 100-500A. As shown, lower interconnect wire 110' is defined by polysilicon element 250a with conductive silicide region 252a, bottom electrode plate 126' is defined by polysilicon element 250b with conductive silicide region 252b, and each TFR head 170' is defined by a respective polysilicon element 250c with conductive silicide region 252c.

Although the metal silicide regions 252a-252c may be very thin compared with the underlying polysilicon elements 250a-250c, the silicided polysilicon layer (including lower interconnect wire 110', bottom electrode plate 126', and TFR heads 170') defines a lower metal layer $M_x$ for the purposes of the present disclosure. In this example embodiment, the silicided polysilicon layer $M_x$ may define a layer $M_0$ (where x=0) below a first metal interconnect layer $M_1$ (where $M_{x+1}=M_1$), often referred to as the metal-1 layer.

The invention claimed is:

1. An integrated circuit structure, including:
   (a) a metal-insulator-metal (MIM) capacitor, comprising:
      an MIM bottom electrode including:
         a bottom electrode plate formed in a first metal layer; and
         a bottom electrode cup including a laterally-extending bottom electrode cup base and a plurality of vertically-extending bottom electrode cup sidewalls extending upwardly from the bottom electrode cup base;
      a bottom plate contact via separate from and spaced laterally apart from the bottom electrode cup;
      an MIM top electrode formed in a second metal layer above the first metal layer; and
      a bottom electrode connection pad conductively connected to the bottom electrode plate by the bottom plate contact via; and
      an MIM insulator including:
         an insulator base arranged between the MIM top electrode and the bottom electrode cup base; and
         a plurality of vertically-extending insulator sidewalls, each arranged between the MIM top electrode and a respective bottom electrode cup sidewall; and
   (b) a thin-film resistor (TFR), comprising:
      a pair of TFR heads formed in the first metal layer; and
      a TFR element connected to the pair of TFR heads by respective ones of a pair of TFR contact vias;
   wherein the bottom electrode cup, the bottom plate contact via, and the pair of TFR contact vias comprise portions of a conformal metal layer.

2. The integrated circuit structure of claim 1, wherein the MIM insulator is cup-shaped.

3. The integrated circuit structure of claim 1, wherein respective ones of the pair of TFR contact vias and the vertically-extending bottom electrode cup sidewalls are formed in a dielectric region between the first metal layer and the second metal layer.

4. The integrated circuit structure of claim 1, wherein:
   the TFR includes a TFR insulator cap formed on the TFR element; and
   the TFR insulator cap and the MIM insulator are formed in an insulator layer.

5. The integrated circuit structure of claim 1, further comprising an interconnect structure including:

a lower interconnect wire formed in the first metal layer; and an upper interconnect wire formed in the second metal layer and connected to the lower interconnect wire by at least one interconnect via.

6. The integrated circuit structure of claim 1, wherein respective ones of the pair of TFR contact vias have a width in a first lateral direction and a length in a second lateral direction, the length in the second lateral direction at least 5 times the width in the first lateral direction.

7. The integrated circuit structure of claim 1, wherein the first metal layer is an interconnect layer comprising copper or aluminum, and the second metal layer comprises aluminum.

8. The integrated circuit structure of claim 1, wherein the first metal layer comprises a silicided polysilicon layer including a metal silicide region formed on each of a plurality of polysilicon regions.

9. An integrated circuit structure, including:
 an interconnect structure comprising:
  a lower interconnect wire; and
  an upper interconnect wire connected to the lower interconnect wire;
  at least one interconnect via connected between the lower interconnect wire and the upper interconnect wire;
 a metal-insulator-metal (MIM) capacitor comprising:
  a bottom electrode plate;
  a bottom electrode cup formed on the bottom electrode plate;
  an MIM top electrode; and
  an MIM insulator arranged between the MIM top electrode and the bottom electrode cup; and
 a thin-film resistor (TFR) comprising:
  a pair of TFR heads; and
  a TFR element connected to the pair of TFR heads;
  a pair of TFR contact vias connected between the pair of TFR heads and the TFR element;
 wherein the lower interconnect wire, the bottom electrode plate, and the pair of TFR heads are formed in a first metal layer;
 wherein the at least one interconnect via, the bottom electrode cup, and the pair of TFR contact vias are formed from a conformal metal layer; and
 wherein the upper interconnect wire and the MIM top electrode are formed in a second metal layer above the first metal layer.

10. The integrated circuit structure of claim 9, wherein the MIM capacitor further comprises a bottom electrode connection pad formed in the second metal layer and connected to the bottom electrode plate by a bottom plate contact via.

11. The integrated circuit structure of claim 9, wherein:
 the bottom electrode cup includes:
  a laterally-extending cup bottom electrode base formed on the bottom electrode plate; and
  a plurality of vertically-extending bottom electrode cup sidewalls;
 the MIM insulator and the MIM top electrode are at least partially located in an interior volume of the bottom electrode cup.

12. The integrated circuit structure of claim 9, wherein the first metal layer is an interconnect layer comprising copper or aluminum, and the second metal layer comprises aluminum.

13. The integrated circuit structure of claim 9, wherein the first metal layer comprises a silicided polysilicon layer including a metal silicide region formed on each of a plurality of polysilicon regions.

14. A method of forming an integrated circuit structure including a metal-insulator-metal (MIM) capacitor and a thin-film resistor (TFR), the method comprising:
 forming a plurality of first conductive elements in a first metal layer, the plurality of first conductive elements including:
  an MIM bottom electrode plate; and
  first and second TFR heads;
 forming a MIM bottom electrode cup over the MIM bottom electrode plate;
 forming a first TFR contact via conductively connected to the first TFR head and a second TFR contact via conductively connected to the second TFR head;
 wherein the MIM bottom electrode cup, the first TFR contact via, and the second TFR contact via are formed concurrently;
 forming a TFR element conductively connected to the first TFR head through the first TFR contact via and conductively connected to the second TFR head through the second TFR contact via;
 forming an insulator layer above the first metal layer to define:
  a cup-shaped MIM insulator over the MIM bottom electrode cup; and
  a TFR insulator cap over the TFR element; and
 forming a plurality of second conductive elements in a second metal layer above the first metal layer, the plurality of second conductive elements including an MIM top electrode over the cup-shaped MIM insulator;
 wherein the MIM insulator is formed between the MIM bottom electrode plate and the MIM top electrode.

15. The method of claim 14, wherein the MIM bottom electrode cup includes a bottom electrode cup base and multiple vertically-extending bottom electrode cup sidewalls extending upwardly from the bottom electrode cup base; and
 wherein the MIM insulator includes multiple vertically-extending insulator sidewalls, each formed adjacent a respective vertically-extending MIM bottom electrode sidewall.

16. The method of claim 14, further comprising, after forming the plurality of first conductive elements in the first metal layer and before forming the TFR element,
 forming at least one MIM bottom plate contact via concurrently with the MIM bottom electrode cup, the first TFR contact via, and the second TFR contact via; and
 wherein the plurality of second conductive elements includes a bottom electrode connection pad connected to the MIM bottom electrode plate by at least one MIM bottom plate contact via.

17. The method of claim 14, wherein the MIM bottom electrode cup includes:
 a laterally-extending bottom electrode cup base; and
 multiple vertically-extending bottom electrode cup sidewalls;
 wherein the cup-shaped MIM insulator and the MIM top electrode are formed at least partially in an interior volume of the MIM bottom electrode cup.

18. The method of claim 14, wherein:
 the plurality of first conductive elements further includes a lower interconnect wire; and
 the plurality of second conductive elements further includes an upper interconnect wire connected to the lower interconnect wire by at least one interconnect via.

19. The method of claim 14, wherein:
forming the TFR element comprises forming and patterning a TFR layer to form:
(a) the TFR element; and
(b) a TFR layer region over the MIM bottom electrode cup; and
wherein the MIM insulator is formed over the TFR layer region.

20. The method of claim 14, comprising:
forming a TFR layer extending over the MIM bottom electrode cup and over the first and second TFR contact vias;
forming an insulation layer over the TFR layer;
patterning and etching the TFR layer and insulation layer to define:
the TFR element;
the cup-shaped MIM insulator; and
the TFR insulator cap over the TFR element.

21. The method of claim 14, comprising:
forming a TFR layer extending over the MIM bottom electrode cup and over the first and second TFR contact vias;
forming an insulation layer over the TFR layer;
patterning and etching the TFR layer and the insulation layer to define:
a first remaining portion of the TFR layer defining the TFR element;
a second remaining portion of the TFR layer defining a TFR layer region over the MIM bottom electrode cup;
a first remaining portion of the insulation layer defining the TFR insulator cap over the TFR element; and
a second remaining portion of the insulation layer defining the cup-shaped MIM insulator, wherein the TFR layer region is located between the MIM bottom electrode cup and the cup-shaped MIM insulator.

* * * * *